United States Patent
Wu et al.

(10) Patent No.: US 9,280,051 B2
(45) Date of Patent: Mar. 8, 2016

(54) METHODS FOR REDUCING LINE WIDTH ROUGHNESS AND/OR CRITICAL DIMENSION NONUNIFORMITY IN A PATTERNED PHOTORESIST LAYER

(71) Applicant: APPLIED MATERIALS, INC., Santa Clara, CA (US)

(72) Inventors: Banqiu Wu, San Jose, CA (US); Ajay Kumar, Cupertino, CA (US); Rao Yalamanchili, Morgan Hill, CA (US); Omkaram Nalamasu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 39 days.

(21) Appl. No.: 14/301,835

(22) Filed: Jun. 11, 2014

(65) Prior Publication Data

US 2014/0370709 A1 Dec. 18, 2014

Related U.S. Application Data

(60) Provisional application No. 61/834,390, filed on Jun. 12, 2013.

(51) Int. Cl.
*H01L 21/302* (2006.01)
*G03F 7/26* (2006.01)
*H01L 21/308* (2006.01)
*H01L 21/027* (2006.01)

(52) U.S. Cl.
CPC .............. *G03F 7/26* (2013.01); *H01L 21/0273* (2013.01); *H01L 21/3086* (2013.01)

(58) Field of Classification Search
USPC ......... 438/706, 710, 712, 714, 717, 723, 725, 438/736
See application file for complete search history.

(56) References Cited

U.S. PATENT DOCUMENTS

| | | | |
|---|---|---|---|
| 6,147,005 A | 11/2000 | Tu et al. | |
| 6,235,214 B1 | 5/2001 | Deshmukh et al. | |
| 6,312,616 B1 | 11/2001 | Chinn et al. | |
| 6,583,063 B1 | 6/2003 | Khan et al. | |
| 8,133,817 B2 | 3/2012 | Sasano et al. | |
| 8,435,419 B2 | 5/2013 | Ding et al. | |
| 2005/0037610 A1* | 2/2005 | Cha et al. | 438/637 |
| 2008/0045022 A1* | 2/2008 | Kurihara et al. | 438/694 |
| 2010/0308014 A1 | 12/2010 | Cheshire | |
| 2013/0224960 A1 | 8/2013 | Payyapilly et al. | |

OTHER PUBLICATIONS

U.S. Appl. No. 13/938,186, filed Jul. 9, 2013, Liu et al.
U.S. Appl. No. 14/204,668, filed Mar. 11, 2014, Banna et al.
U.S. Appl. No. 14/301,847, filed Jun. 11, 2014, Wu et al.
U.S. Appl. No. 14/306,535, filed Jun. 17, 2014, Cho et al.
U.S. Appl. No. 14/313,246, filed Jun. 24, 2014, Kim et al.

* cited by examiner

*Primary Examiner* — Lan Vinh
(74) *Attorney, Agent, or Firm* — Moser Taboada; Alan Taboada

(57) ABSTRACT

Methods for reducing line width roughness and/or critical dimension nonuniformity in a photoresist pattern are provided herein. In some embodiments, a method of reducing line width roughness along a sidewall of a patterned photoresist layer disposed atop a substrate includes: (a) depositing a first layer atop the sidewall of the patterned photoresist layer; (b) etching the first layer and the sidewall after depositing the first layer to reduce the line width roughness of the patterned photoresist layer. In some embodiments, (a)-(b) may be repeated until the line width roughness is substantially smooth.

19 Claims, 3 Drawing Sheets

METHODS FOR REDUCING LINE WIDTH ROUGHNESS AND/OR CRITICAL DIMENSION NONUNIFORMITY IN A PATTERNED PHOTORESIST LAYER

CROSS-REFERENCE TO RELATED APPLICATIONS

This application claims benefit of U.S. provisional patent application Ser. No. 61/834,390, filed Jun. 12, 2013, which is herein incorporated by reference in its entirety.

FIELD

Embodiments of the present disclosure generally relate to semiconductor substrate processing systems. More specifically, the present disclosure relates processing photoresist patterns in substrate processing systems.

BACKGROUND

As the dimensions of integrated circuit components decrease, more elements are put in a given area of a semiconductor integrated circuit. Accordingly, lithography processes have become more and more challenging to transfer even smaller features (e.g., less than 64 nm) onto a substrate precisely and accurately without damage. In order to transfer precise and accurate features onto a substrate, a desired high resolution lithography process requires having a suitable light source that may provide radiation at a desired wavelength range for exposure. Furthermore, the lithography process requires transferring features onto a photoresist layer with minimum photoresist line width roughness (LWR) and acceptable critical dimension uniformity. A defect-free photomask is required to transfer desired features onto the photoresist layer.

Accordingly, the inventors have provided improved methods for reducing the line width roughness and/or critical dimension nonuniformity on a patterned photoresist layer.

SUMMARY

Methods for reducing line width roughness and/or critical dimension nonuniformity in a photoresist pattern are provided herein. In some embodiments, a method of reducing line width roughness along a sidewall of a patterned photoresist layer disposed atop a substrate includes: (a) depositing a first layer atop the sidewall of the patterned photoresist layer; (b) etching the first layer and the sidewall after depositing the first layer to reduce the line width roughness of the patterned photoresist layer. In some embodiments, (a)-(b) may be repeated until the line width roughness is substantially smooth.

In some embodiments, a method of reducing line width roughness along a sidewall of a patterned photoresist layer disposed atop a substrate includes (a) patterning a photoresist layer atop a substrate, wherein the patterned photoresist layer has a line width roughness along a sidewall of the patterned photoresist layer; (b) depositing a first layer atop the sidewall of the patterned photoresist layer; (c) etching the first layer and the sidewall after depositing the first layer; and (d) repeating (b) and (c) until the line width roughness is substantially smooth.

In some embodiments, a computer readable medium is provided having instructions stored thereon that, when executed, causes a process chamber to perform a method for reducing line width roughness along a sidewall of a patterned photoresist layer disposed atop a substrate. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
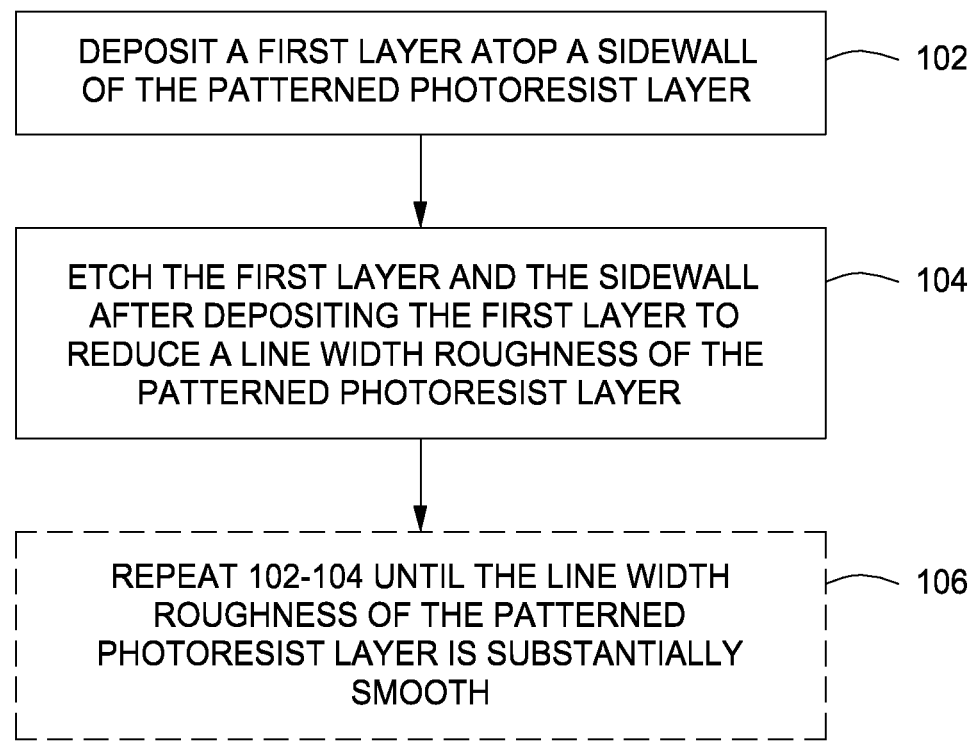
FIG. 1 depicts a flow chart of a method for reducing the line width roughness on a photoresist pattern in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for reducing line width roughness and/or critical dimension nonuniformity in a photoresist pattern are provided herein. Embodiments of the present disclosure may advantageously reduce line width roughness in a photoresist pattern, resulting in an improvement in the uniformity of critical dimensions of an integrated circuit.

FIG. 1 depicts a flow chart of a method 100 for reducing the line width roughness of a patterned photoresist layer in accordance with some embodiments of the present disclosure. The method 100 is described herein with respect to the structure depicted in FIGS. 2A-2E.

Figure 2A:
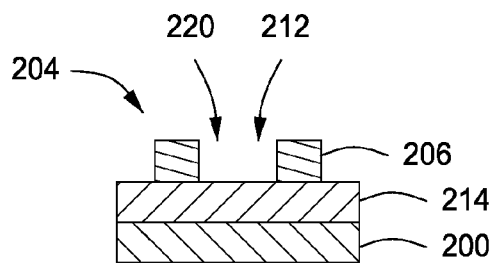
FIGS. 2A-2E depict stages of reduction in the line width roughness on a photoresist pattern in accordance with some embodiments of the present disclosure.

FIG. 2A depicts a patterned photoresist layer 204 formed atop a substrate 200. The substrate 200 may comprise any suitable material used in the fabrication of semiconductor devices. For example, in some embodiments, the substrate 200 may comprise a semiconducting material and/or combinations of semiconducting materials and non-semiconductive materials for forming semiconductor structures and/or devices. For example, the substrate 200 may comprise one or more silicon-containing materials such as crystalline silicon (e.g., Si<100> or Si<111>), strained silicon, polysilicon, germanium, silicon germanium, or the like. The substrate 200 may further have any desired geometry, such as a 200 or 300 mm wafer, square or rectangular panels, or the like. In some embodiments, the substrate 200 may be a semiconductor wafer (e.g., a 200 mm, 300 mm, or the like silicon wafer). In some embodiments, the substrate 200 may include one or more layers (not shown) disposed atop, or formed within the substrate 200, for example, one or more of a dielectric layer, tunnel oxide layer, or the like.

In some embodiments, one or more layers 214 may be disposed atop the substrate 200. For example, in some embodiments as shown in FIG. 2A, a gate stack may be disposed atop the substrate 200. In some embodiments, the gate stack may have a plurality of layers comprising any materials suitable to fabricate a desired device. For example, in some embodiments, the plurality of layers may include one or more oxide layers, such as silicon oxide ($SiO_2$), one or more nitride layers, such as silicon nitride (SiN), combinations thereof, or the like. In some embodiments, the plurality of layers may comprise alternating oxide layers and nitride layers. In some embodiments, the pattern, for example of alternating oxide layers and nitride layers may repeat any number of times necessary to form a gate stack having a desired thickness. Each of the layers may have any thickness suitable to facilitate fabricating a desired device. In some embodiments, the layers may all have the same thickness, or in some embodiments, the layers may have varying thicknesses.

The photoresist layer 204 may comprise any photoresist materials suitable to provide a template to facilitate etching the one or more layers 214 having desired features. For example, in some embodiments, the photoresist layer 204 may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. The photoresist layer 204 may be formed by any suitable process, for example, a patterned etch process, spin coating process, optical lithography techniques, or the like. The photoresist layer 204 may be formed to any thickness suitable to etch a desires number of features in the one or more layers 214. For example, in some embodiments, the photoresist layer may have a thickness of about 20 nm to about 300 nm.

In some embodiments, the photoresist layer 204 may have a first pattern 212 to be etched into the one or more layers 214. In some embodiments, the first pattern 212 comprises openings 220 defined between the patterned photoresist layer 204 to expose the underlying layers 214 for etching in order to transfer features onto the underlying layers 214. However, inaccurate control or low resolution of the lithography exposure process may cause poor critical dimension control in the photoresist layer 204, thereby resulting in unacceptable line width roughness along the sidewalls 206 of the photoresist layer 204. A large line width roughness may result in inaccurate feature transfer to the underlying layers 214, eventually leading to device failure and yield loss. In some embodiments, the line width roughness along the sidewalls 206 of the patterned photoresist layer 204 includes of a series of dents 218 and bumps 216 along the sidewall 206 of the patterned photoresist layer 204.

Figure 2B:
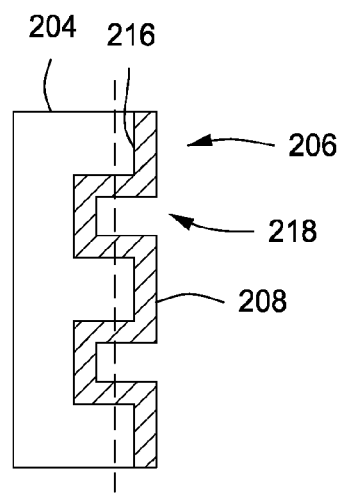

The method 100 of reducing the line width roughness on a photoresist pattern begins at 102. FIG. 2B depicts a top view of the line width roughness of the sidewalls 206 of the photoresist layer 204. As depicted in FIG. 2B, a first layer 208 is deposited atop the sidewalls 206 of the patterned photoresist layer 204 for a first period of time. In some embodiments, the first layer 208 is deposited atop the bumps 216 and within the dents 218.

The inventors have observed that typical methods of smoothing the line width roughness of a photoresist layer (sometimes referred to as line edge roughness), such as a chemical rinse or a plasma-etch process only, result in the rapid consumption of the photoresist layer. As a result, the inventors have observed that the deposition of the first layer 208 advantageously fills the dents 218 in the sidewalls 206 to reduce the line width roughness and advantageously reduces the amount of photoresist material consumed by the subsequent etch process described below.

In some embodiments, the deposition process may be performed for a preset first period of time. In some embodiments, the first layer 208 is deposited for a period of about 0.2 seconds to about 3 seconds. In some embodiments, a greater amount of first layer 208 is deposited within the dents 218 than atop the bumps 216. In some embodiments, the ratio of the amount of first layer 208 deposited atop the bumps 216 to the amount of first layer 208 deposited within the dents 218 is about 0.5 to about 1.5. In some embodiments, the first layer 208 is deposited within the dents 218 to a thickness of about 0.2 nm to about 1 nm in a given deposition process.

The first layer 208 may be deposited via any process suitable to deposit the first layer 208. In some embodiments, the first layer may be deposited via a deposition process performed in an etch chamber, thereby advantageously enabling faster processing by alternation of etch and deposition processes in the same chamber. Alternatively, in some embodiments, the first layer may be deposited via a chemical vapor deposition (CVD) process in a suitable CVD process chamber. The etch chamber or the CVD chamber may be a standalone process chamber or a part of a cluster tool, as described below with respect to FIG. 3.

In some embodiments the first layer 208 comprises any suitable material such as a fluorocarbon polymer or a hydrofluorocarbon polymer or the like. In some embodiments, the first layer 208 is deposited by providing a process gas to the process chamber. In some embodiments, suitable process gases comprise tetrafluoromethane ($CF_4$), octafluorocyclobutane ($C_4F_8$), difluoromethane ($CH_2F_2$), methane ($CH_4$), methyl trifluoride ($CHF_3$) or the like. In some embodiments, the process gas is provided at a flow rate of about 20 sccm to about 300 sccm, for example about 100 sccm. In some embodiments, the pressure within the process chamber during deposition is about 10 millitorr to about 100 millitorr. RF power at a suitable magnitude and frequency is provided to form a plasma from the process gas. For example, in some embodiments, about 200 watts to about 500 watts of RF power is provided at a frequency of about 2 to about 60 MHz. In some embodiments, an RF bias power is applied to the substrate 200 during the deposition process. Applying RF bias power advantageously allows for control over the thickness of the first layer formed over the sidewalls 206. In some embodiments, the RF bias power has a frequency of about 2 to about 50 MHz. In some embodiments, the bias power is about 5 watts to about 100 watts.

Figure 2C:
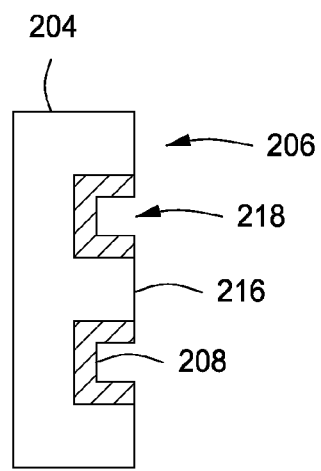

Next, at 104, the sidewalls 206 are etched for a second period of time after depositing the first layer 208 to reduce the line width roughness. FIG. 2C depicts a top view of the sidewalls 206 of the photoresist layer 204 after etching, showing the reduced line width roughness. As depicted in FIG. 2C, the etching process smoothes the bumps 216 that make up the line width roughness while not completely removing material deposited in the dents 218.

In some embodiments, the etching process is performed for a preset second period of time. In some embodiments, the etching process is performed for a period of about 0.2 seconds to about 3 seconds. In some embodiments, the etching process etches a portion of the bumps 216 as well as a portion of the first layer 208 deposited atop the bumps 216 and within the dents 218. In some embodiments, a greater amount of bump 216 material is etched away as compared to the amount of first layer 208 deposited within the dents 218 that is etched away. In some embodiments, the ratio of the amount of bump 216 material etched away to the amount of first layer 208 within the dents 218 that is etched away is about 5 to about 1.

In some embodiments, the etch process may be performed using a suitable plasma etching process in a suitable process chamber, which may be the same process chamber as used to deposit the first layer described above, or a different chamber. In some embodiments, the etch chamber may be a standalone process chamber or a part of a cluster tool as described in FIG. 3.

In some embodiments, a process gas, supplied to a process chamber may be ignited to form an etching plasma. The process gas may be any suitable process gas used to form a plasma. In some embodiments, where the materials selected for the photoresist layer 204 are organic materials, the process gas may be an oxygen containing gas, for example, oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), and the like. In some embodiments, other process gases may be supplied to the process chamber, individually or simultaneously with the oxygen containing gas. For example, the process gas may include nitrogen gas ($N_2$), ammonia ($NH_3$), chlorine gas ($Cl_2$), or an inert gas such as argon (Ar). In some embodiments, the process gas is supplied to the process chamber at flow rate of about 20 sccm to about 300 sccm. In some embodiments, the process gas is ignited via an RF power source providing about 200 watts to about 500 watts of power at a frequency of about 2 to about 60 MHz. In some embodiments, an RF bias power is applied to the substrate 200 during the etching process. Applying RF bias power during the etching process advantageously enhance the transport of plasma species created by the etching plasma to the surface of the substrate 200. In some embodiments, the RF bias power has a frequency of about 2 to about 50 MHz. In some embodiments, the bias power is about 5 watts to about 100 watts.

Figure 2D:
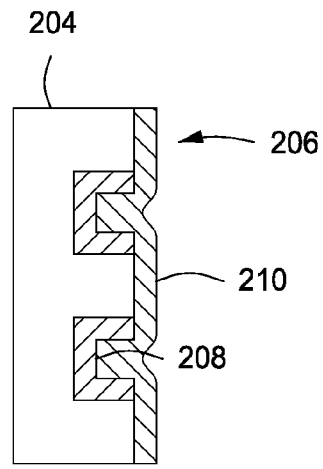

If the reduction in line width roughness is acceptable, the method 100 may end at this point. Alternatively, and optionally, at 106, the deposition and etching steps described above are repeated to further reduce the line width roughness. FIG. 2D depicts a top view of the sidewalls 206 of the photoresist layer 204 undergoing a second deposition and etch cycle, showing a further reduced line width roughness. As depicted in FIG. 2D, repeating the deposition and etch cycle further fills in the dents 218 with an additional amount of first layer material 210 to further smooth the bumps 216 that make up the line width roughness.

Figure 2E:
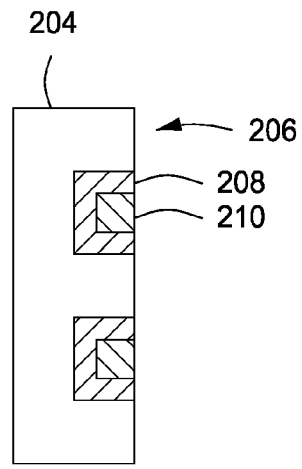

In some embodiments, the deposition and etching cycles are repeated for a set period of time. In some embodiments, the deposition and etching cycles are repeated for a total time of about 30 seconds to about 240 seconds. In some embodiments, the deposition and etching cycles are repeated until a desired degree of line width roughness is achieved (e.g., until the bumps 216 are smoothed out and the dents 218 are filled in). Following completion of method 100, the sidewalls of the patterned photoresist layer 204 comprise a substantially smooth edge surface defining a first pattern 212 in the patterned photoresist layer 204 that exposes the underlying gate stack (e.g., layers 214) for etching. FIG. 2E depicts a top view of the line width roughness of the sidewalls 206 of the photoresist layer 204 that has a substantially smooth edge surface following application of method 100. In some embodiments, the line width roughness of the sidewalls 206 of the photoresist layer 204 is reduced between about 20 percent to about 40 percent. In some embodiments, a substantially smooth edge surface is achieved when the line width roughness is reduced to a range of about less than about 4 nm. In some embodiments, the line width roughness may be reduced to a range of about 2 nm to about 3 nm. In some embodiments, the line width roughness may be reduced to a range of about less than about 2 nm.

The methods of the present disclosure may be done in a single process chamber capable of performing both etching and deposition, such as any of the Advantedge™ or DPS® line of process chambers commercially available from Applied Materials, located in Santa Clara, Calif. Such a suitable process chamber may be a standalone process chamber, or part of a cluster tool. Alternatively, the inventive methods disclosed herein may be performed in separate chambers that also may be standalone or part of a cluster tool.

Figure 3:
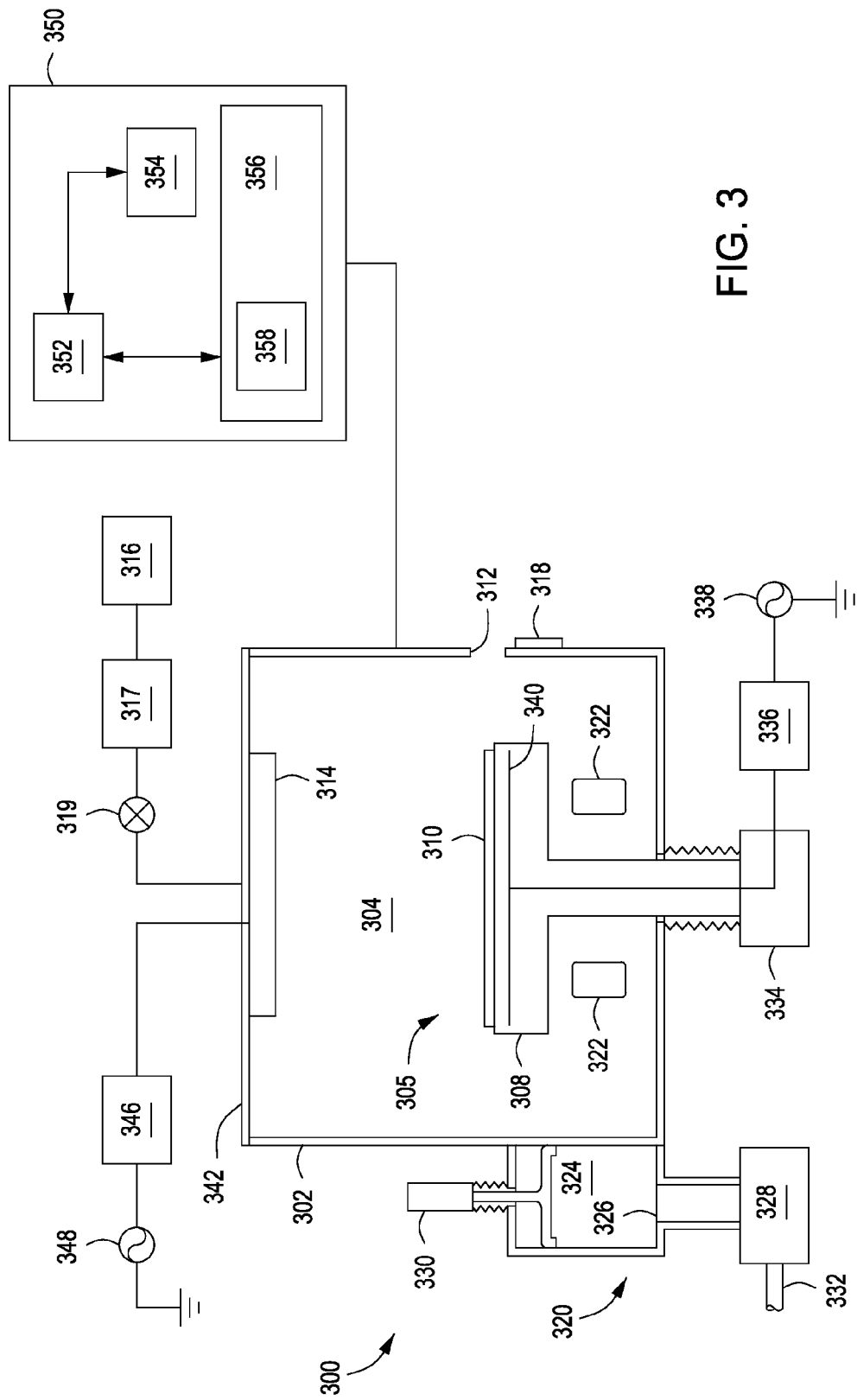
FIG. 3 depicts an etch reactor in accordance with some embodiments of the present disclosure, suitable for performing embodiments of the methods disclosed herein.

FIG. 3 depicts an apparatus 300 suitable for processing a substrate in accordance with some embodiments of the present disclosure. The apparatus 300 may comprise a controller 350 and a process chamber 302 having an exhaust system 320 for removing excess process gases, processing by-products, or the like, from the interior of the process chamber 302. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 thereupon during processing and one or more gas inlets, such as a showerhead 314 and/or nozzles provided at desired locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

For example, in some embodiments, the substrate support pedestal 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. In some embodiments, three bias power sources may be provided for coupling RF power through respective matching networks to the RF bias electrode 340 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at desired flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases as desired to the process chamber 302, such as the base of the process chamber, the periphery of the substrate support pedestal, or the like.

In some embodiments, the apparatus 300 may utilize capacitively coupled RF power for plasma processing, although the apparatus may also or alternatively use inductive coupling of RF power for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust as required to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller) 350 that controls the chamber operation such that the methods disclosed herein are performed.

While the foregoing is directed to embodiments of the present disclosure, other and further embodiments of the disclosure may be devised without departing from the basic scope thereof.

The invention claimed is:

1. A method of reducing line width roughness along a sidewall of a patterned photoresist layer disposed atop a substrate, the method comprising:
   (a) depositing a first layer atop the sidewall of the patterned photoresist layer, wherein the sidewall comprises a series of dents and bumps along the sidewall of the patterned photoresist layer; and
   (b) etching the first layer and the sidewall after depositing the first layer to reduce the line width roughness of the patterned photoresist layer, wherein an amount of first layer material etched from the bumps is greater than an amount of first layer material etched from within the dents, and wherein a portion of material from the first layer remains to fill the dents of the sidewall after all etching processes have been completed.

2. The method of claim 1, further comprising:
   (c) repeating (a)-(b) until the line width roughness is less than about 4 nm.

3. The method of claim 1, further comprising:
   (c) repeating (a)-(b) until the line width roughness is less than about 2 nm.

4. The method of claim 1, further comprising:
   (c) repeating (a)-(b) until the line width roughness is reduced by about 20 percent to about 40 percent.

5. The method of claim 1, wherein the first layer is deposited for a first period of time of about 0.2 seconds to about 3 seconds, and wherein the first layer and the sidewall are etched for a second period of time of about 0.2 seconds to about 3 seconds.

6. The method of claim 1, wherein the first layer is deposited to a thickness of about 0.2 nm to about 1 nm.

7. The method of claim 1, further comprising applying an RF bias power to the substrate during (a), during (b), or during (a) and (b).

8. The method of claim 1, wherein a ratio of an amount of first layer material deposited atop the bumps to an amount of first layer material deposited within the dents is about 0.5 nm to about 1.5 nm.

9. The method of claim 1, further comprising:
(c) repeating (a)-(b) until the line width roughness is substantially smooth.

10. The method of claim 9, wherein (a)-(b) are repeated for a total time of about 30 seconds to about 240 seconds.

11. A method of reducing line width roughness along a sidewall of a patterned photoresist layer disposed atop a substrate, comprising:
(a) patterning a photoresist layer atop a substrate, wherein the patterned photoresist layer has a line width roughness along a sidewall of the patterned photoresist layer;
(b) depositing a first layer atop the sidewall of the patterned photoresist layer, wherein the sidewall comprises a series of dents and bumps along the sidewall of the patterned photoresist layer;
(c) etching the first layer and the sidewall after depositing the first layer, wherein an amount of first layer material etched from the bumps is greater than an amount of first layer material etched from within the dents; and
(d) repeating (b) and (c) until the line width roughness is substantially smooth, wherein a portion of material from the first layer remains to fill the dents of the sidewall after all etching processes have been completed.

12. The method of claim 11, wherein the first layer is deposited for a first period of time of about 0.2 seconds to about 3 seconds.

13. The method of claim 11, wherein the first layer and the sidewall are etched for a second period of time of about 0.2 seconds to about 3 seconds.

14. The method of claim 11, wherein (b)-(c) are repeated for a total time of about 30 seconds to about 240 seconds.

15. The method of claim 11, wherein the first layer is deposited to a thickness of about 0.2 nm to about 1 nm.

16. The method of claim 11, further comprising applying an RF bias power to the substrate during (b), or during (c), or during (b) and (c).

17. The method of claim 11, further comprising terminating the repeating of (b)-(c) when the line width roughness is less than about 4 nm.

18. The method of claim 11, further comprising terminating the repeating of (b)-(c) when the line width roughness is less than about 2 nm.

19. The method of claim 11, wherein the line width roughness is reduced by about 20 percent to about 40 percent.

* * * * *